United States Patent [19]
Fratin et al.

[11] Patent Number: 5,977,591
[45] Date of Patent: Nov. 2, 1999

[54] HIGH-VOLTAGE-RESISTANT MOS TRANSISTOR, AND CORRESPONDING MANUFACTURING PROCESS

[75] Inventors: Lorenzo Fratin, Milan; Carlo Riva, Renate, both of Italy

[73] Assignee: SGS-Thomson Microelectronics S.r.l., Agrate Brianza, Italy

[21] Appl. No.: 08/824,888

[22] Filed: Mar. 18, 1997

[30] Foreign Application Priority Data

Mar. 29, 1996 [EP] European Pat. Off. .............. 96830175

[51] Int. Cl.⁶ ........................... H01L 29/76; H01L 29/94; H01L 31/062
[52] U.S. Cl. ........................... 257/344; 257/407; 257/408
[58] Field of Search ..................................... 257/408, 344, 257/336, 409, 412, 316, 407, 326, 315

[56] References Cited

U.S. PATENT DOCUMENTS

| | | | |
|---|---|---|---|
| 4,745,079 | 5/1988 | Pfiester | 437/29 |
| 5,279,976 | 1/1994 | Hayden et al. | 437/31 |
| 5,418,392 | 5/1995 | Tanabe | 257/336 |
| 5,464,784 | 11/1995 | Crisenza et al. | 257/326 |
| 5,466,958 | 11/1995 | Kakumu | 257/345 |

FOREIGN PATENT DOCUMENTS

| | | | |
|---|---|---|---|
| 0 255 159 A3 | 3/1988 | European Pat. Off. | 257/315 |
| 56-050574 | 5/1981 | Japan | 257/407 |
| 57-148375 | 9/1982 | Japan | 257/344 |
| 60-043863 | 3/1985 | Japan | 257/344 |
| 61-43477A | 3/1986 | Japan | 257/344 |
| 63-73566 | 4/1988 | Japan | 257/315 |
| 1232765 | 9/1989 | Japan | 257/344 |

*Primary Examiner*—Steven H. Loke
*Attorney, Agent, or Firm*—Allen, Dyer, Doppelt, Milbrath & Gilchrist, P.A.

[57] ABSTRACT

A MOS transistor capable of withstanding relatively high voltages is of a type integrated on a region included in a substrate of semiconductor material, having conductivity of a first type and comprising a channel region intermediate between a first active region of source and a second active region of drain. Both these source and drain regions have conductivity of a second type and extend from a first surface of the substrate. The transistor also has a gate which includes at least a first polysilicon layer overlying the first surface of at least the channel region, to which it is coupled capacitively through a gate oxide layer. According to the invention, the first polysilicon layer includes a mid-portion which only overlies the channel region and has a first total conductivity of the first type, and a peripheral portion with a second total conductivity differentiated from the first total conductivity. The peripheral portion partly overlies the source and drain active regions toward the channel region.

9 Claims, 6 Drawing Sheets

HIGH-VOLTAGE-RESISTANT MOS TRANSISTOR, AND CORRESPONDING MANUFACTURING PROCESS

FIELD OF THE INVENTION

This invention relates to a MOS transistor capable of withstanding high voltages, and to a manufacturing method therefor. The invention specifically concerns a MOS transistor, as integrated on a region included in a substrate of semiconductor material, which region has conductivity of a first type and comprises a channel region intermediate between a first active region of source and a second active region of drain. Both of these regions have conductivity of a second type and extend from a first surface of the substrate. The transistor also has a gate which comprises at least a first polysilicon layer overlying the first surface of at least the channel region, to which it is coupled capacitively through a gate oxide layer. The invention relates in particular, but not exclusively, to high-voltage transistor structures and protection structures formed in integrated circuits which also include non-volatile memory cells of the EPROM, FLASH or EEPROM types. This description will make reference to such an application by way of non-limitative example.

BACKGROUND OF THE INVENTION

As is well known, electronic devices of the kind of devices that include non-volatile memory circuits, are normally supplied with relatively low voltages, on the order of a few volts. Reference will be made specifically to integrated circuits on a substrate of semiconductor material, usually of monocrystalline silicon. It is frequently necessary, however, that such devices be able to withstand higher working voltages than usually borne.

In fact, on one hand in some applications certain circuit portions are subjected to predetermined voltages, either external or generated within the device, which are relatively high. In the instance of non-volatile memory circuits, such as EPROM, FLASH or EEPROM memories, for example the memory cells programming voltages may attain values on the order of several times the supply voltage value.

On the other hand, instantaneous overvoltages of very high values, or electrostatic discharges—typically at the device terminals for connection with the outside, i.e. at the interconnection pins provided in the package encapsulating the device—may occur incidentally. Such occurrences can affect the circuit elements located in close proximity of the interconnections. In all of the above cases, the circuit elements of the device are required to operate properly and not be damaged.

As those skilled in the art know well, whereas in the presence of definitely high voltages, on the order of a few tens of volts and up to a few hundred volts, additional protection structures such as "field plates" are formed at the involved transistors. With relatively lower high voltages, such as those under specific consideration herein, no additional protection structures are provided, rather such circuit elements themselves that are more directly affected are formed using specific techniques for high voltages.

Particularly MOS transistors, whether of the P-channel or N-channel type, capable of withstanding high voltages, commonly have a suitably modified structure compared to a standard type of MOS transistor. Commonly and in the present invention, transistors for high voltages, capable of withstanding up to a few tens of volts, are made using conventional processes of the CMOS (Complementary MOS) type, which allow N-channel and P-channel MOS transistors to be formed simultaneously. In the instance of non-volatile memory circuits, the process may be arranged such that memory cell arrays are also formed in the same circuit. In this case, the MOS transistors may either be, for example, selection transistors internal of the array or external circuitry transistors, and moreover, the cell element itself is a MOS transistor of the floating gate type.

To fully appreciate the invention objects, first the structure of a standard MOS transistor should be held in mind, that is, a transistor structure which can withstand relatively low voltages not definitely exceeding the supply voltage, similar to each of the transistors that make up the CMOS pair. The transistor comprises an active region of source and an active region of drain which are formed, by implantation, directly in the substrate, or alternatively, in an N-well for P-channel transistors and in a P-well (or P-tub) for N-channel transistors. The two active regions, which are homogeneous and similarly doped, extend from one of the major surfaces of the chip of semiconductor material and have opposite polarity from that of the substrate or the well in which they are formed. An intermediate channel region separates the source and drain active regions, which are disposed symmetrically about the channel region. A gate consisting of one or two polysilicon layers, according to the technology used, is disposed over the substrate and separated from the latter by a relatively thin layer of gate oxide, thereby to overlie at least the channel region.

The gate polysilicon functions as a conductor, and is contacted at the top by a metallic layer, or gate electrode. For this purpose, the polysilicon is doped to enhance its conductivity, and usually has polarity of the N type, as is the case, for instance, in memory circuit applications. It should be further considered that in standard MOS transistors, both source and drain active regions have regular shapes, substantially rectangular in cross-section along the source-to-drain line.

On the contrary, transistors for relatively high voltages in CMOS processes usually have certain features that characterize and distinguish them from the standard ones just described. First of all, their source and drain active regions—and the latter especially—are arranged to form so-called gradually doped or graded junctions. That is, the junctions are formed such that the dopant concentration increases gradually from the edge of the channel region toward the contacts of the source and drain regions. This allows high breakdown voltages to be achieved for such junctions.

This taper in the diffused source and drain regions can be obtained by different techniques to provide different implant profiles. One of the commonest techniques for forming such regions is known as the LDD technique, and includes a further implantation being carried out at a relatively low dosage in the proximity of the channel region.

Sometimes the structure includes, in particular, a low-concentration doping of the drain junction in the proximity of the gate, to form the so-called drain extension which allows the electric field to be limited to within the area between the gate and the drain region. Accordingly, the working voltage range that the transistor can withstand is expanded without the gate oxide between the drain and the gate being ruptured by the injection of high-energy electrons into the gate oxide from the channel region.

A second structural feature of transistors for high voltages is the provision of gate oxides of much greater thickness (approximately 50% thicker) than the standard thickness, i.e. the so-called high-voltage oxides. In this way, it can be ensured that such an oxide of increased thickness will withstand applied voltages of even a much higher value than the integrated circuit supply voltage. The above technique, while being widely practiced, has certain limitations where still higher voltages are to be tolerated.

To make MOS transistors resistant to pulsed high voltages, such as in the case of transistors which are to provide protection against electrostatic discharges, in another prior art technique, the integrated structure of the transistor is altered to make it "stronger". Specifically, the drain region, which is formed in a suitable well having a low dopant concentration, can be regarded as theoretically split into three sub-regions: the drain in the typical sense of the word which consists of a layer with a high dopant concentration; a portion of the well itself; and a side portion of the well under the gate oxide, which also has a low dopant concentration. Provided between the last-mentioned portion and the drain is an insulation layer covered by an insulating oxide layer which is partly overlaid by the gate electrode and having a dopant concentration of an intermediate level to the drain and the well concentrations. Such transistor structures, while being effective even at high voltages, are nevertheless fairly complicated, and unlike the CMOS transistors described above, cannot be conveniently formed using standard techniques.

The underlying technical problem of the present invention is to provide a MOS transistor for high voltages, illustratively of up to a few tens of volts, which can function as a protection against electrostatic discharges, and which has such structural features that it can be made with a standard technology, in particular a CMOS technology. Another problem of the invention is to provide a MOS transistor which is compatible with the manufacturing processes for non-volatile memories, e.g. FLASH, EPROM and EEPROM memories.

SUMMARY OF THE INVENTION

An important idea of the invention includes arranging for the gate polysilicon doping to be non-uniform, and in particular of making it different in the proximities of the source and drain active regions from the mid-portion which overlies the channel region, thereby creating shallow extensions to the active regions and, therefore, further tapering the electric field in border areas between the channel region and the source and drain active regions, respectively.

More particularly, a MOS transistor capable of withstanding relatively high voltages is integrated on a region, included in a substrate of semiconductor material, which has conductivity of a first type. This region includes a channel region intermediate to a first active region of source and a second active region of drain, both of which regions have conductivity of a second type and extend from a first surface of the substrate. The transistor also has a gate comprising at least a first polysilicon layer overlying the first surface of at least the channel region, to which it is coupled capacitively through a gate oxide layer. According to the invention, the transistor is characterized in that the first polysilicon layer includes a mid-portion which only overlies the channel region and has a first total conductivity of the first type, and a peripheral portion with a second total conductivity differentiated from the first total conductivity, which portion partly overlies the source and drain active regions toward the channel region.

To understand what is meant here by the term "total conductivity", it should be recalled that the semiconductor material regions, specifically the portions of a polysilicon layer, may optionally be subjected, in the course of the device formation process, even to a dual implantation of dopants having opposite conductivities, N and P. Where a concentration of dopant of one type is present already and the doped material has acquired a corresponding conductivity, the implantation of dopants of the opposite type represents a counteracting implantation that alters the layer conductivity. Thus, "total conductivity" is the conductivity, eventually obtained and actually measurable at the end of the implantations, which results from the presence of one or two dopant species.

Accordingly, in the present invention, the total conductivity of the second type is differentiated from the total conductivity of the first type, the term "differentiated" meaning that the peripheral portion may likewise have total conductivity of the second or the first type, but in either cases lower in absolute value than that of the mid-portion.

In this way, an area of depletion of charges of the first type, or area of migration of charges of the second type, constituting a dummy extension of the source and drain diffusions, will form beneath the peripheral portion of the first polysilicon layer, peripherally with respect to the active regions in the aforementioned substrate region, that is, in the channel region close to the active regions. The source and drain junctions will grade, therefore, toward the channel region.

Advantageously, the source and drain active regions may be simultaneously formed with the same implantation as for doping the peripheral portion of the polysilicon. Therefore, the active regions will self-align with the gate polysilicon, while on the other side, the extensions formed in accordance with the invention will be automatically aligned with the peripheral portion of the polysilicon.

The transistor can be formed with CMOS technology concurrently with non-volatile memories, either by a single-poly process whereby a single layer of polysilicon is provided, or a double-poly process whereby two polysilicon layers are provided. Where two layers of polysilicon are provided, a first layer forms the gate and the second layer, overlying the first, can be conveniently used as a masking layer for implanting the peripheral portion.

A process according to the invention is for forming a MOS transistor resistant to high voltages, as formed in a region included in a substrate of semiconductor material having conductivity of a first type and a comprising channel region which separates a first active region of source from a second active region of drain, both regions having conductivity of a second type and extending from a first surface of the substrate. The process provides according to the invention, following the formation, over the first surface of at least a portion of the region included in the substrate, of a layer of gate oxide and a first layer of gate polysilicon, the following steps:

forming a masking layer over a mid-portion of the polysilicon layer so as to leave exposed a peripheral portion of the polysilicon layer overlying the border area between the channel region and the source and drain active regions, respectively; and implanting the peripheral portion of said first polysilicon layer uncovered by said masking layer to obtain a total conductivity differentiated from the total conductivity obtained in the mid-portion.

BRIEF DESCRIPTION OF THE DRAWINGS

The features and advantages of a MOS transistor according to this invention will be more clearly apparent from the following detailed description of embodiments thereof, given by way of non-limitative example with reference to the accompanying drawings. In the drawings.

DETAILED DESCRIPTION OF THE PREFERRED EMBODIMENTS

Figure 1:
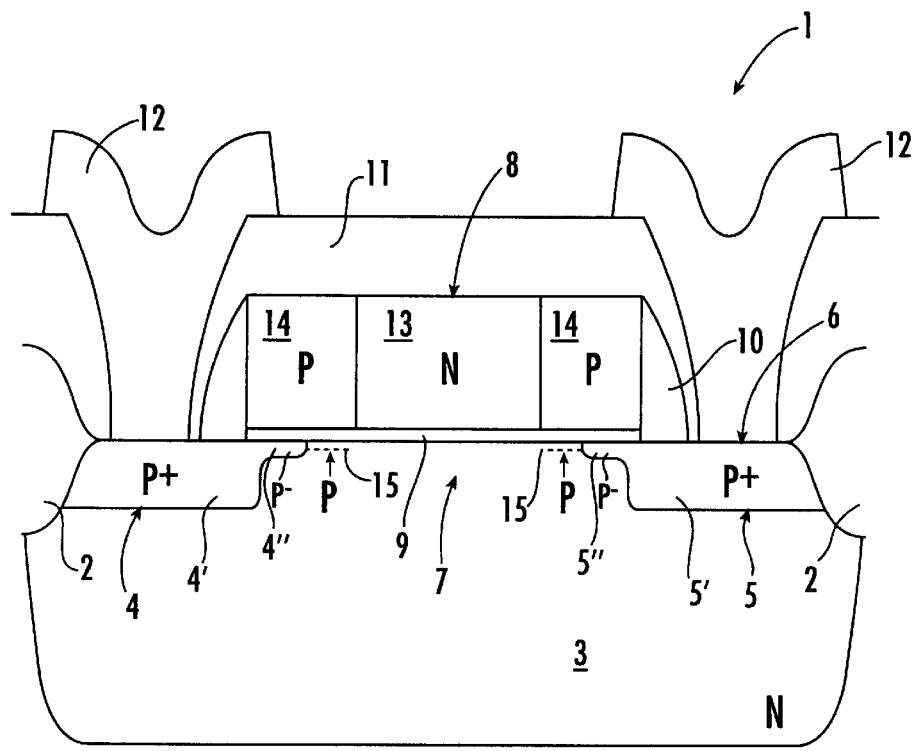
FIG. 1 shows schematically a first embodiment of a P-channel MOS transistor with a single polysilicon level, according to this invention.
Figure 2:
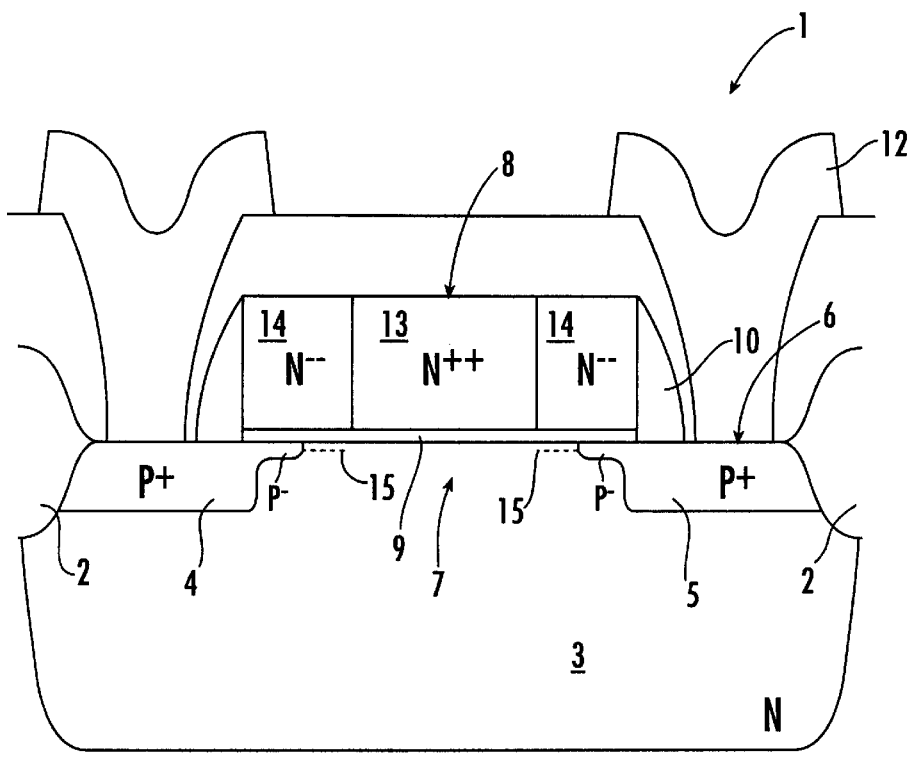
FIG. 2 shows a second embodiment of a transistor having a single polysilicon level.

The particular instance of a P-channel MOS transistor will be considered throughout this detailed description. Referring to FIGS. 1 and 2, generally and schematically shown at 1 is a P-channel MOS transistor made in accordance with this invention. These figures show vertical section views, drawn out of scale for clarity, which are taken along a line joining the active regions, as explained hereinafter. The transistor 1 of this embodiment, providing a schematic overall picture of the invention, has a single gate layer. By way of example, it has been represented as a transistor of the CMOS type having a single polysilicon layer and being useful in memory circuits. Its basic structure is consistent with that of a CMOS transistor for relatively high voltages of up to a few tens of volts, and has extensions of the LDD type to ends of the active regions in proximity to the channel region.

Referring again to FIGS. 1 and 2, the structure of the transistor 1 is formed in an active area region which is bounded by field oxide regions, only partially visible and indicated at 2. In particular, the transistor 1 is integrated inside a well 3 which is included in a substrate of a semiconductor material, commonly monocrystalline silicon, not shown in the figures. The well 3 has conductivity of a first type which, for the P-channel transistor 1, is of the N type to provide a so-called N-well. Alternatively, the transistor could be formed directly in the substrate, where the substrate conductivity is of the N type.

The transistor 1 comprises a first active region for the source and a second active region for the drain, as respectively denoted by 4 and 5. Both active regions 4 and 5 have conductivity of a second type, specifically of the P type, and extend from a first major surface, shown at 6, of the substrate or monosilicon chip. The active regions are separated by an intermediate channel region 7 which is part of the well 3. In particular, as shown in the figures, the regions 4 and 5 are arranged symmetrically about the channel region 7.

In order for the transistor 1 to be capable of withstanding relatively high voltages, the source and drain regions 4 and 5 are not fully homogeneous but have extensions toward the channel region. In fact, two differently doped portions can be identified in each of the regions 4 and 5, namely: a heavily doped or P+ portion forming the active region in the proper or conventional sense of the word, as respectively indicated at 4' and 5', and a lightly doped or P-portion 4" and 5" which forms the extension. By way of example, the figures show extensions of the LDD type.

The transistor 1 also has a gate which, as previously mentioned, comprises a single layer of a material adapted to be made conductive, typically a layer 8 of polysilicon. The gate locates over the surface 6 at least connected with the channel region 7. A relatively thin layer 9 of gate oxide, whose thickness ranges from 100 mm or less to a few hundreds of microns, couples the gate of the transistor 1 capacitively to the channel region 7. The thickness of the gate oxide varies depending on the application and the greater the thickness, the higher is the voltage that the transistor can withstand.

Shown in FIGS. 1 and 2 on each side of the gate are so-called side spacers 10 made of an insulating material, usually silicon oxide, and passivation layers 11 formed over the gate to insulate and protect the transistor 1. Metallization lines 12 contact the source and drain active regions through openings made in the insulating layers 11.

In accordance with this invention, the polysilicon gate layer 8 has two distinct portions which are differently doped, namely: a mid-portion overlying the channel region only, and a peripheral portion which partly overlies the active regions. In FIGS. 1 and 2, the mid-portion is denoted by 13, and the peripheral portion of which two regions are shown in section, respectively at the locations of the source active region and the drain active region, is denoted by 14 for both. The two portions have different total conductivities either in that these are opposite types or different in value. Referring in particular to FIG. 1, the mid-portion 13 of the polysilicon layer 8 has total conductivity of the N type, as shown. The peripheral portion 14 has opposite total conductivity, i.e. conductivity of the P type.

The P-type dopant diffuses from the peripheral polysilicon portion 14 partway into the area of the well 3 (that is, of the channel region 7) which has conductivity of the N type, beneath the peripheral portion 14. Thus, a pair of shallow regions 15 are created, as shown in phantom lines in FIG. 1, which are P-doped and locate close to the active regions, in particular to the extensions 4" and 5" thereof. These regions 15 represent further extensions of the active regions. Their depth is approximately smaller than that of the extensions.

It should be noted that in this first embodiment, both portions 13 and 14 are assumed to have been doped sufficiently to bring the polysilicon 8 to its degenerate state. The mid-portion 13 of the gate polysilicon, which entirely overhangs the channel region 7, sets the threshold value VT, negative as known, for the transistor 1 as in conventional transistors. The peripheral portion 14 has a lower threshold, by as much as about 1 volt, than the previous portion due to the decrease in the metal-to-semiconductor potential ($\Phi_{MS}$) brought about by the degenerate state of the polysilicon. In other words, where the mid-portion implantations are effected to set the threshold VT to about −1 volt for instance, the peripheral portions are advantageously reversed even at zero gate potential, i.e., with the gate off, and can therefore be rightly regarded as extensions of the source and drain diffusions.

A second embodiment of the invention is illustrated by FIG. 2. In this case, while the polysilicon mid-portion 13 is again N-doped, the peripheral portion 14 has a doping of the same type, but has significantly lower conductivity in absolute value. In other words, and as shown in FIG. 2, the portion 13 is doped N++ and the portion 14 is doped N--. The notations "++" and "--" are used here to indicate a substantial separation of the two conductivity values from each other.

Here again, a pair of shallow regions 15 appear in the channel region 7 beneath the peripheral portion 14. In this embodiment, they represent depleted regions of the N-type channel region due to migration of the dopant toward the lightly doped peripheral portion 14 of the polysilicon. Thus, the work function will be changed in those regions, and the threshold lowered from the threshold set by the mid-portion. The source 4 and drain 5 active regions have, therefore, as it were extensions, represented by the regions 15, with substantially no doping.

In connection with the embodiment shown in FIG. 2, it should be considered that subsequent and further thermal treatments, through the device completion stages, may promote a diffusion of dopants from the heavily doped mid-portion to the peripheral portion, thereby altering the transistor performance.

In both of the embodiments shown in FIGS. 1 and 2, the polysilicon mid-portion 13 is of the N type and degenerate. Thus, a transistor can be provided with a threshold voltage which is simply determined by the amount of dopant selected during its formation process. In essence, this invention requires that the peripheral portion 14 of the polysilicon has a "differentiated" total conductivity from that of the mid-portion 13. This allows the source and drain junctions, and hence the corresponding source-to-drain electric field, to be graded in this invention. Thus, as a result of the electric field being so between the active regions, the transistor will be uniquely capable of withstanding high voltages, even more than 12 volts, up to junction breakdown. In addition, it will be self-protected against degrading phenomena incidental and consequent to high voltages, such as electrostatic discharges near the pins, for example, or phenomena due to the presence of high-energy carriers, better known as hot carriers, that may impair proper operation of the transistor. In addition, the gate-to-source and gate-to-drain resistances are lowered because it is as if the active regions had a top extension in the peripheral portion of the gate polysilicon.

It should be noted that, as shown in the figures, the transistor 1 has larger dimensions than a standard transistor. In fact, the width of the transistor gate is illustratively greater in this invention. Assuming that the minimum dimension attainable with a given technology allowing for necessary tolerances is Y, the minimum gate width will be 3Y for the transistor 1. This is no disadvantage, however, the transistor being instead particularly suitable for high-voltage protection applications where small dimensions are not required. It should also be noted that the lengths of the additional extensions of the active regions are determined automatically in this invention with the formation of the peripheral portion. The structure of an N-channel transistor would exhibit reversed conductivities as would be readily appreciated by those skilled in the art.

Figure 3:
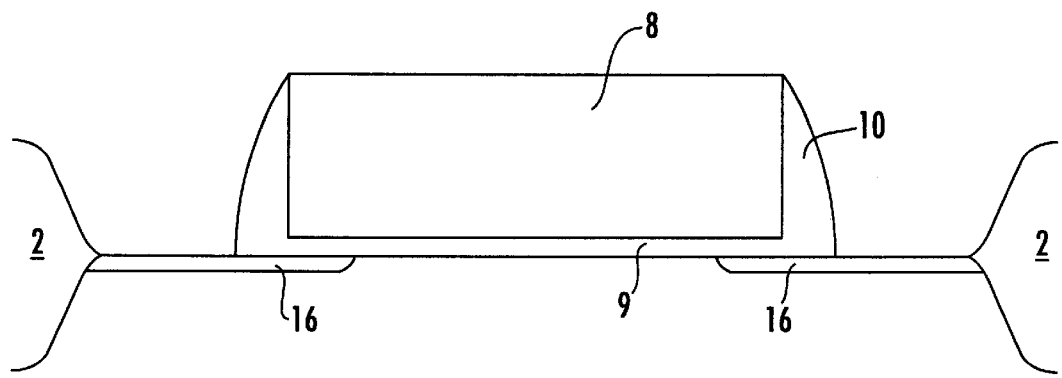
FIGS. 3–5 illustrate some successive major steps in the manufacturing of the transistor of FIG. 1 or 2 by a process of the CMOS type.
Figure 4:
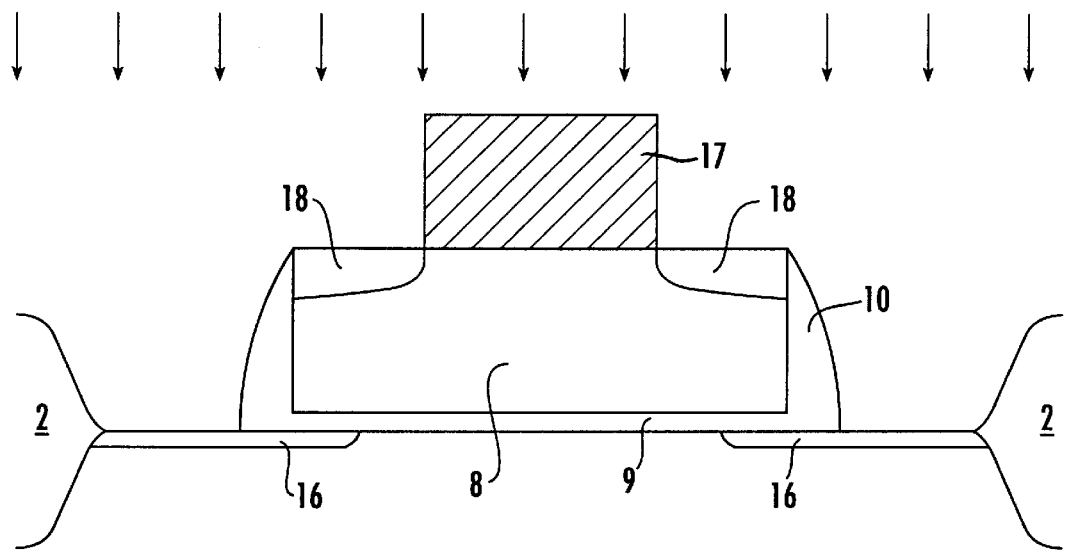
Figure 5:
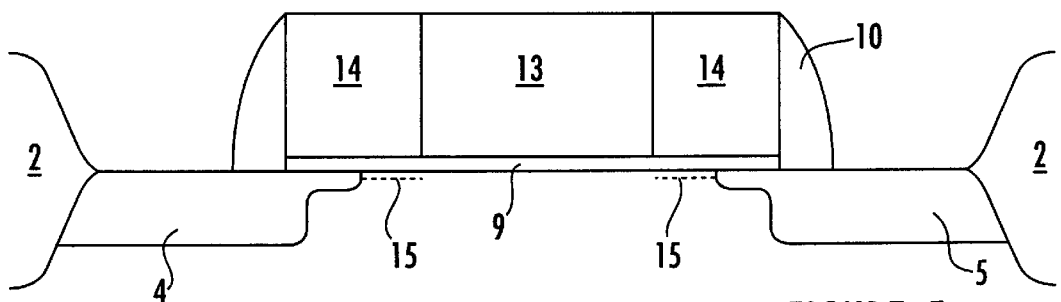

FIGS. 3–5 illustrate certain steps of a preferred process for forming a transistor as shown in the previous figures, which process is compatible with a single polysilicon process, particularly in relation to the forming of two differently doped gate regions. Reference is made likewise to either of the embodiments described above.

FIG. 3 shows the structure of the transistor 1 at a conventional stage preceding the use of this invention. The gate polysilicon 8 has been formed and patterned to define its dimensions, typically increased as previously explained, and provided with side spacers 10. The polysilicon layer 8 is uniformly doped, for example, with N-type impurities to degenerate it. At the channel region sides, shallow regions 16 have been formed which extend up to the field oxide across the active area partly underlying the gate. These regions will form the extensions of the source 4" and drain 5" active regions, respectively.

A masking layer 17 is then applied and defined, as shown in FIG. 4, over the polysilicon layer 8. The masking layer 17 only partly covers the polysilicon 8, leaving exposed regions near the edge of the polysilicon. In particular, the masking layer fully covers only that area which is to form the mid-portion. As explained hereinafter in relation to a specific embodiment, this layer may either be a sacrificial layer, such as a resist layer, or a permanent layer. FIG. 1 and 2 illustrate the instance of a sacrificial layer, which is removed afterwards.

The polysilicon layer is then subjected to an implantation, with dopant ion typically of the P type, shown by arrows in FIG. 4. Preferably, this implant is the exactly same that has to be used to form the source and drain active regions. Indicated at 18 in FIG. 4 are the projected ranges in the polysilicon layer 8 attained during this step.

The dopant is then diffused into the polysilicon layer 8 to form two different regions: the mid-portion 13 and the peripheral portion 14, as shown in FIG. 5. The active regions 4 and 5 are also formed which will advantageously come out self-aligned from this preferred process.

The exposed surface, assumed to be of the N type, is then reverse-implanted. The resultant total conductivity of the peripheral portion will be dependent on the implant dosage. Where this is suitably heavy to provide a sufficient concentration of dopants, the effective or total conductivity of the polysilicon will be reversed in this portion. Otherwise, the N-type conductivity of the polysilicon will be in any case decreased by the addition of P-dopants. This process requires no additional steps because masks or layers, as may be already provided for by the process, can be used for the step of forming the implant masking layer. Also, the source and drain implants are conveniently utilized to implant the peripheral portion 14 of the gate polysilicon 8.

At the start of these process steps, the polysilicon is typically lightly N-doped, using concentrations within the range of E19 to E20 atoms/cm$^3$. The P-type implant for reversing the peripheral portion is illustratively around 2–5 E15 cm$^{-2}$. Of interest, before the two portions are differentiated the polysilicon might be lightly N-doped or P-doped instead of being definitely N type as in the assumption. In this case, the peripheral portion would still be implanted with dopants of the P type. However, it might be necessary to perform a further implantation of just the mid-portion of the polysilicon to have it degenerate.

In this respect, it is preferred in this invention that the polysilicon 8, albeit degenerate, be relatively lightly doped so as to aid in the reverse-implanting of the peripheral portion 14 of the polysilicon gate layer. The transistor of this invention will, therefore, advantageously suit salicide-based processes or, more generally, dual-gate processes wherein the polysilicon doping is particularly adequate.

To further illustrate this invention, some preferred examples of application of the inventive principles to a transistor to be obtained by a CMOS type of process with a dual polysilicon layer will now be given. This transistor can be used, for example, as a selection transistor or external circuit transistor for non-volatile memory circuits, such as EPROM, FLASH, or EEPROM.

Figure 6:
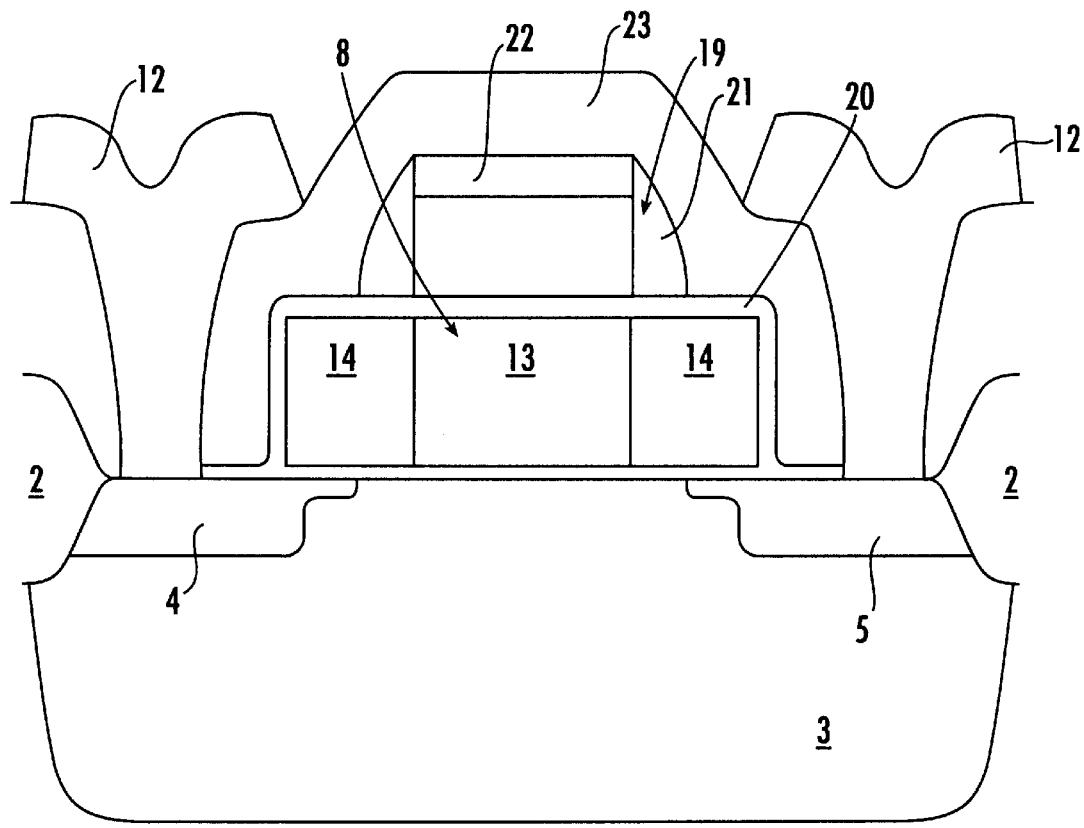
FIG. 6 is a sectional view taken along line A—A of the transistor shown in FIG. 6.

A vertical cross-section through a transistor according to one embodiment of the present invention which is compatible with circuits for memories of the FLASH type is shown in FIG. 6. This structure is, similar to that of FIGS. 1 and 2, for a high-voltage transistor having active regions with LDD extensions. Here again, similar regions are denoted by the same reference numerals. The transistor gate comprises two polysilicon layers in this case. A first underlayer 8 of polysilicon is separated, in accordance with the invention, into two differently doped portions 13 and 14, as widely described in the foregoing. Notice that, as regards the doping of the two portions, either of the cases illustrated by FIGS. 1 and 2 are possible, although it is preferred that the peripheral portion has opposite conductivity from the mid-portion.

A second polysilicon layer, denoted by 19 in figure, is formed over the first polysilicon layer 8. An intermediate layer of a dielectric material, the so-called intermediate dielectric 20, acts as an insulating layer between the two layers and is also provided on the sidewalls of the first layer. As shown in the figure, the second polysilicon layer 19 is disposed at the mid-portion 13 of the first polysilicon layer 8 to fully cover this portion only.

In this example, the second polysilicon layer 19 is not electrically active because it is fully insulated and the transistor gate is only formed of the first polysilicon layer 8. As explained later on in relation to a transistor manufacturing process, the second polysilicon layer 19 basically performs the same function as the masking layer 17 shown in FIG. 4, in that it only allows of the definition of the peripheral portion 14 of the transistor gate polysilicon.

Spacers 21 are formed laterally of the overlying layer 19. As shown in the figure, a silicide layer 22 may be provided over the latter in accordance with a common technology. The transistor is insulated and protected by a passivation layer 23.

Figure 7:
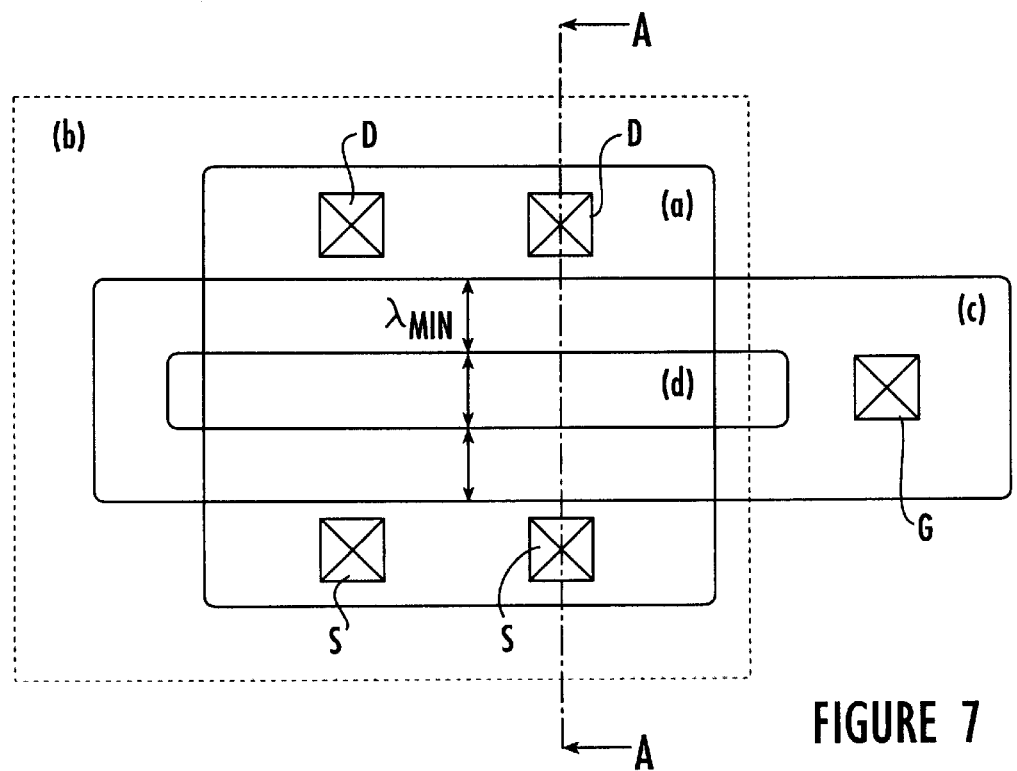
FIG. 7 is a top plan view of a first embodiment of a P-channel MOS transistor made by a dual polysilicon level process, according to this invention.

For a better understanding of the layout, a top plan view of the transistor 1 is also shown in FIG. 7. FIG. 6 is taken along a dash line A—A led through the source and drain active regions. The two figures are not drawn to the same scale.

A region (a) represents the active area where the transistor 1 is formed. Encircled with a dash line is a substrate region (b) which is to be implanted for the formation of the source and drain active regions, and which according to the invention allows the peripheral portion of the first polysilicon layer to be formed. The source and drain contacts within the active area (a) are denoted by S and D, respectively.

The first and second polysilicon layers are denoted by (c) and (d), respectively. A gate contact G is formed on the first polysilicon layer (c), which is active. Notice that for proper formation of the two polysilicon layers, the layout should include possible misalignment tolerances, indicated as minimum length $\lambda_{min}$ in the figure.

The next figures illustrate sequential steps of a DPCC process useful for simultaneously forming a transistor like that of FIG. 6 and memory cells, not shown in the figures.

Figure 8:
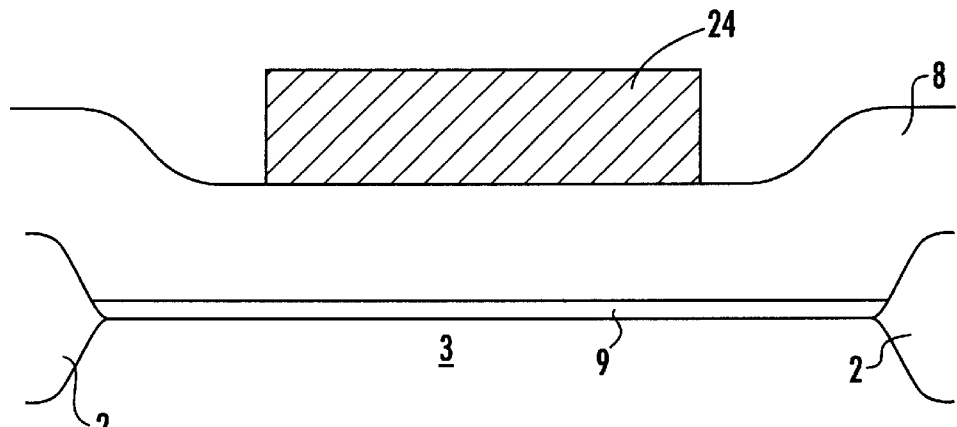
FIGS. 8–12 illustrate steps of a CMOS process for manufacturing the dual polysilicon transistor of FIGS. 6 and 7.

After the active area is defined by the formation of field oxide regions 2, and the well 3 by implantation, a gate oxide which is preferably of the HV (High Voltage) type and relatively thick is grown thermally. As shown in FIG. 8, the first layer 8 of polysilicon, or poly1, is deposited over the whole structure and lightly doped. The mask 24 of photosensitive material, typically a photoresist, is applied for its definition.

Figure 9:
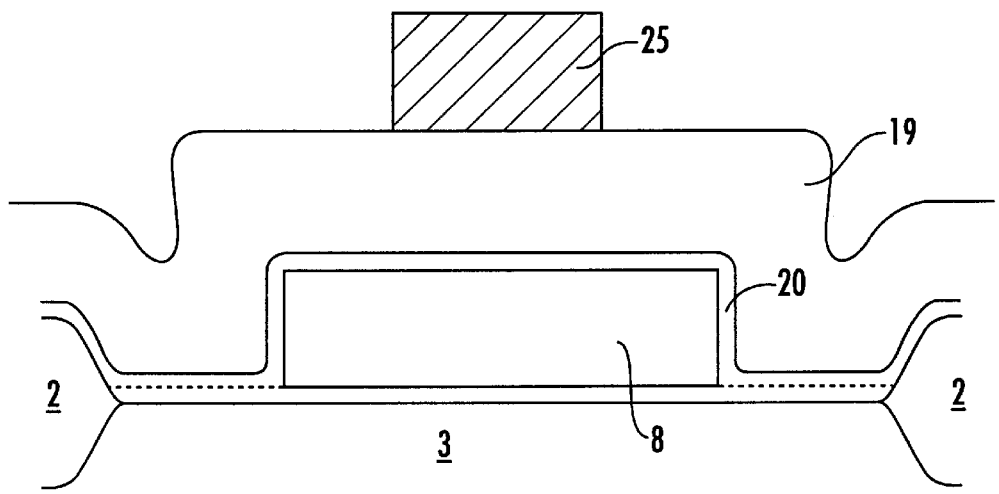

The layer 8 is then etched to a desired pattern shown, for example, as region (c) in FIG. 7. As shown in FIG. 9, a dielectric interpoly layer is then formed, either by deposition or growth, which might consist of several superimposed layers (typically oxide/nitride/oxide in this order). It is not removed from the so-called "matrix" mask that enables the etching away of the intermediate dielectric in the region of the memory cells to allow the first polysilicon layer to be shorted to the second polysilicon layer that will be formed. The second polysilicon layer 19 is then deposited over the structure and preferably overlaid with a silicide layer, not shown.

A mask 25, shown in FIG. 9, is then used to define the second polysilicon layer which is known as "poly circuitry" and, in a conventional process, fully covers the circuitry region outside the matrix to allow definition, as by etching, in a self-aligned manner of both polysilicon layers in the memory cells. The etching at the transistor stops by selectivity at the dielectric interpoly 20.

Figure 10:
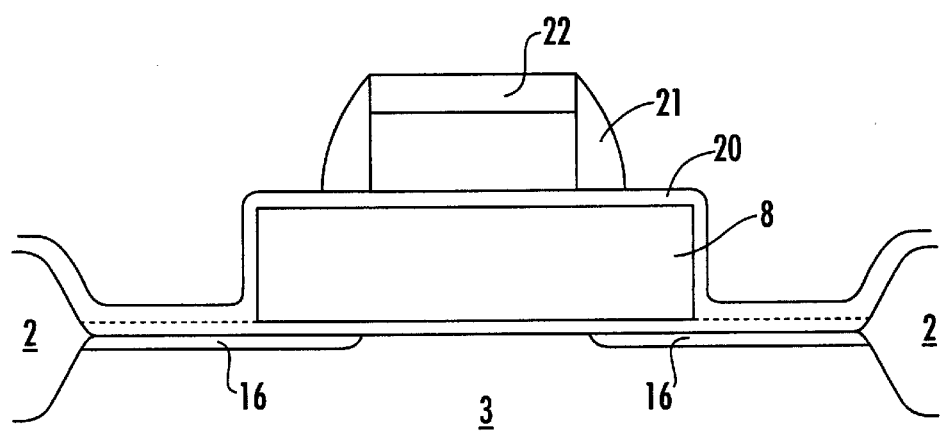

The resultant structure after the formation of side spacers and a low-dosage implantation of the active regions is shown in FIG. 10. In this figure, the silicide layer 22 is shown separate from the second polysilicon layer 19 for clarity.

Figure 11:
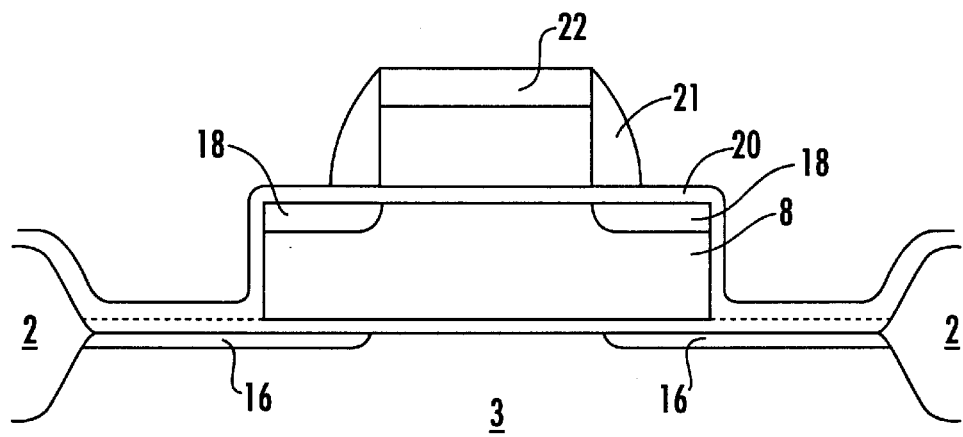
Figure 12:
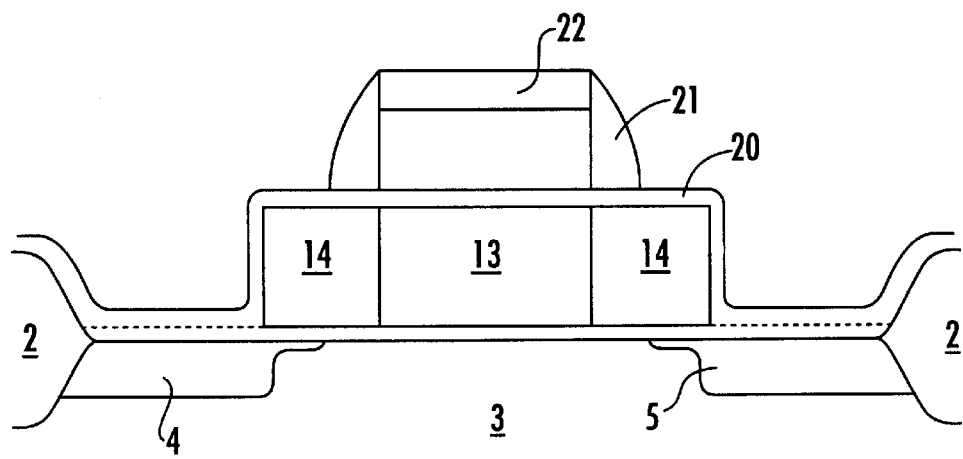

At this stage, and in the same way as for conventional P-channel transistors, a P+ source and drain implantation is carried out as shown in FIG. 11. FIG. 12 shows the structure after the dopants have been activated and diffused thermally. Active regions and the peripheral portion 14 of the first polysilicon layer are, therefore, formed simultaneously. Thus, the transistor of this embodiment is fully compatible with the commonly practiced process technology, and involves no additional process steps.

Figure 13:
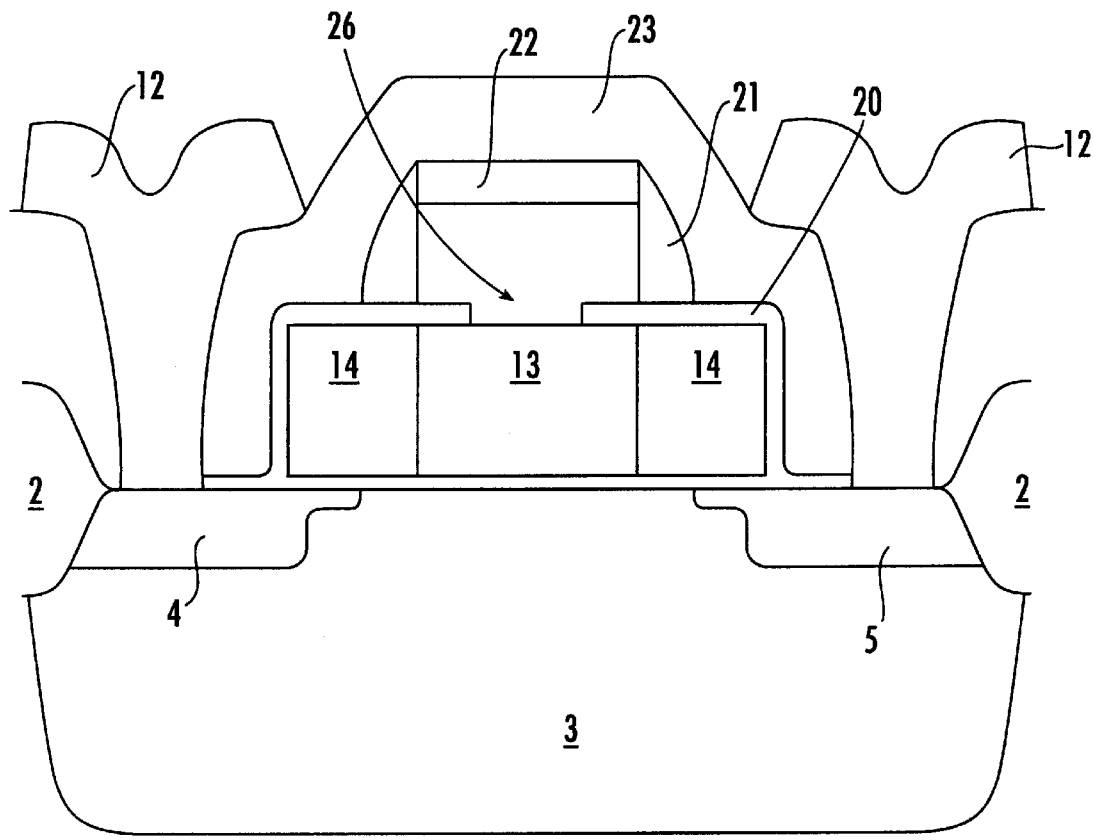
FIG. 13 is a section view taken along line B—B of the transistor shown in FIG. 13.
Figure 14:
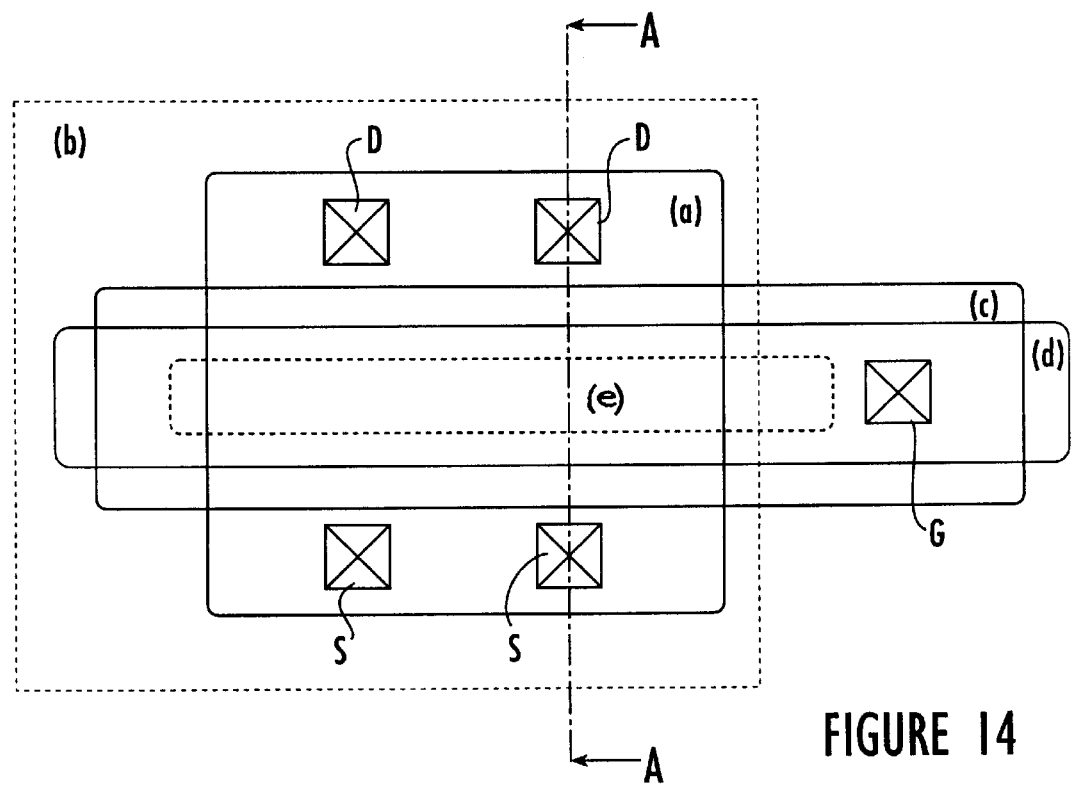
FIG. 14 is a top plan view of a second embodiment of a MOS transistor having a dual level of polysilicon.

FIGS. 14 and 13 are a plan and a sectional view taken along a line B—B, respectively, of a second embodiment of the transistor according to this invention. This is a modified embodiment with respect to the previous example wherein the first and second polysilicon layers are shorted together, as are the memory cells.

As shown in FIG. 13, the intermediate dielectric is partly removed in a central area 26, at the location of the mid-portion 13. In particular, the area 26 is contained fully within the mid-portion 13 of the first polysilicon, that is, away from the edges of the second polysilicon layer 19. The region of contact is shown in phantom lines in FIG. 14 and denoted by (e). In this case, the dimensions will be increased to take into consideration further tolerances for the cutting of the window (e). Advantageously, the short circuit can be obtained using the same mask as in the removal of the intermediate dielectric from the memory cells. In this second example, the second polysilicon layer 19 also is electrically active, and the gate contact, G in FIG. 14, is preferably made on this layer.

In the previous exemplary applications to memories of the FLASH type, reference was made to the single instance of P-channel MOS transistors because these can be conveniently formed using standard technologies. In order to form N-channel transistors for FLASH memories, it should be considered that, with commonly employed technologies whereby the polysilicon layer of the floating gate, i.e. the first polysilicon layer, is N-doped, the two portions of the transistor gate require for proper implantation that the layer be fully masked at the transistor so as to leave it intrinsic. The mid-portion and peripheral portion of the polysilicon layer would be doped separately.

Alternatively, a technology could be used which produced an N type of polysilicon for P-channel transistors, and a P type of polysilicon for N-channel transistors.

While a transistor structure of the CMOS type for high voltages has been described which has LDD extensions of the source and drain regions, it would be possible, within the scope of this invention, for them to have different forms, dependent on the process utilized, or for the active regions proximate to the transistor gate to have different profiles. In either cases, this invention provides enhanced and finer grading of the electric field.

In addition, the transistor of this invention may be formed directly on the substrate, so long as the latter has suitable conductivity, rather than in an N-well or a P-well. Understandably, changes and modifications may be made unto the MOS transistor described hereinabove, within the scope of the present invention as defined in the following claims.

We claim:

1. A MOS transistor capable of withstanding relatively high voltages and comprising:
   a substrate of semiconductor material and including a substrate region having conductivity of a first type, the substrate region comprising a drain region and a source region, and a channel region intermediate between the source and drain regions, both said source and drain regions having conductivity of a second type and extending from a first surface of the substrate, said source and drain regions each including a heavily doped region that forms an active region; and
   a gate comprising at least a first polysilicon layer overlying the first surface of at least above said channel region and a gate oxide layer positioned between said at least a first polysilicon layer and said channel region for capacitively coupling therebetween;
   said at least a first polysilicon layer comprising
      a mid-portion having opposing sides which only overlies said channel region and which has a first total conductivity of the first type, and
      a peripheral portion positioned on each of the opposing sides of said mid-portion, and having a conductivity differentiated from the conductivity in the mid-portion, said peripheral portion at least partly overlying said source and drain regions toward said channel region,
   wherein said source and drain regions each include an extension formed under said corresponding peripheral portions, wherein said extensions are more lightly doped than the heavily doped regions that form the active regions of said source and drain regions, said extensions extending under the outer side of each respective corresponding peripheral portion, and shallow regions formed by dopant diffusion from corresponding peripheral portions that extend from each of said extensions and extend substantially under said corresponding peripheral portions to said mid-portion, wherein said shallow regions have a depth less than said extensions and of different doping concentration, wherein said peripheral portions each comprise at least a concentration of impurities of the second conductivity type.

2. A transistor according to claim 1, wherein said corresponding peripheral portion of said at least a first polysilicon layer partly overlies said source and drain regions.

3. A transistor according to claim 1, wherein the concentration of impurities of the second conductivity type is the same as in said source and drain regions and the type of dopant is also the same.

4. A transistor according to claim 1, further comprising a masking layer formed over said mid-portion of the at least first polysilicon layer leaving said peripheral portion exposed.

5. A transistor according to claim 4, wherein said masking layer comprises a second polysilicon layer.

6. A transistor according to claim 5, further comprising an intermediate dielectric layer positioned to insulate said second polysilicon layer from said at least a first polysilicon layer.

7. A transistor according to claim 5, wherein said at least a first polysilicon layer and said second polysilicon layer are connected together in at least one area adjacent said mid-portion.

8. A transistor according to claim 1, wherein said transistor is implemented in CMOS technology.

9. A transistor according to claim 1, wherein said source and drain regions comprise relatively more lightly doped extensions toward said channel region; wherein said extensions are overlaid by said peripheral portions of said at least a first polysilicon layer.

* * * * *